United States Patent
Moon et al.

(10) Patent No.: US 9,972,810 B2
(45) Date of Patent: May 15, 2018

(54) METHOD OF MANUFACTURING MASK ASSEMBLY USING ELECTROFORMING AND LASER PROCESSES AND METHOD OF MANUFACTURING DISPLAY APPARATUS USING MASK ASSEMBLY

(71) Applicant: Samsung Display Co., Ltd., Yongin-si (KR)

(72) Inventors: Youngmin Moon, Yongin-si (KR); Sungsoon Im, Yongin-si (KR); Kyuhwan Hwang, Yongin-si (KR); Minho Moon, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days. days.

(21) Appl. No.: 15/196,055

(22) Filed: Jun. 29, 2016

(65) Prior Publication Data

US 2017/0162833 A1     Jun. 8, 2017

(30) Foreign Application Priority Data

Dec. 4, 2015   (KR) ........................ 10-2015-0172653

(51) Int. Cl.
*H01L 21/00* (2006.01)
*H01L 51/56* (2006.01)
*B23K 26/382* (2014.01)
*C25D 1/10* (2006.01)
*C25D 1/20* (2006.01)
*G03F 7/20* (2006.01)
*H01L 51/00* (2006.01)
*B23K 101/36* (2006.01)

(52) U.S. Cl.
CPC ............ *H01L 51/56* (2013.01); *B23K 26/382* (2015.10); *C25D 1/10* (2013.01); *C25D 1/20* (2013.01); *G03F 7/20* (2013.01); *H01L 51/0011* (2013.01); *B23K 2201/36* (2013.01); *H01L 2227/323* (2013.01)

(58) Field of Classification Search
CPC ... H01L 51/56; H01L 51/0011; B23K 26/382; C25D 1/10; C25D 1/20; G03F 7/20
USPC ........................................................ 438/22
See application file for complete search history.

(56) References Cited

U.S. PATENT DOCUMENTS

| | | | | |
|---|---|---|---|---|
| 7,732,729 | B2* | 6/2010 | Kobayashi | B23K 26/0853 219/121.62 |
| 9,280,063 | B2* | 3/2016 | Kunnen | G03F 7/70341 |
| 2006/0191786 | A1* | 8/2006 | Yamamoto | C25D 17/06 204/297.06 |
| 2008/0011722 | A1* | 1/2008 | Kobayashi | B23K 26/0853 219/121.62 |

(Continued)

FOREIGN PATENT DOCUMENTS

| JP | 2003-231964 | 8/2003 |
|---|---|---|
| JP | 2006-152396 | 6/2006 |
| JP | 4708735 | 6/2011 |

(Continued)

*Primary Examiner* — Caleb Henry
(74) *Attorney, Agent, or Firm* — H.C. Park & Associates, PLC

(57) ABSTRACT

A method of manufacturing a mask assembly includes forming, via an electroforming process, a base material including at least one opening on an electrode plate; and reprocessing the at least one opening using a laser to form at least one reprocessed opening.

19 Claims, 6 Drawing Sheets

(56) References Cited

U.S. PATENT DOCUMENTS

2014/0087139 A1* 3/2014 Rowley .................... B41C 1/05
428/156

FOREIGN PATENT DOCUMENTS

| KR | 10-2003-0038598 | 5/2003 |
| KR | 10-2013-0025237 | 3/2013 |

* cited by examiner

METHOD OF MANUFACTURING MASK ASSEMBLY USING ELECTROFORMING AND LASER PROCESSES AND METHOD OF MANUFACTURING DISPLAY APPARATUS USING MASK ASSEMBLY

CROSS-REFERENCE TO RELATED APPLICATION

This application claims priority from and the benefit of Korean Patent Application No. 10-2015-0172653, filed on Dec. 4, 2015, which is hereby incorporated by reference for all purposes as if fully set forth herein.

BACKGROUND

Field

Exemplary embodiments relate to a method of manufacturing a mask assembly, and a method of manufacturing a display apparatus using the mask assembly.

Discussion of the Background

Mobile electronic devices, such as mobile phones, notebook computers, personal digital assistants, tablets, etc., are widely used. These devices typically include a display to provide users with visual information, such as an image or video information, in order to support various functions. Components for driving displays have become smaller, but the displays themselves have become more important in conventional mobile electronic devices. It is also noted that a structure for bending a display from a first (e.g., flat) state to a second (e.g., bent at a certain angle) state has been developed.

A conventional mask assembly may be manufactured by rolling a body part and forming an opening in the body part. A size of the opening, however, may be different from a design value, and, as such, manufacturing time may be increased. As such, the opening may not be properly formed, and a display with relatively high resolution may not be manufactured.

The above information disclosed in this Background section is only for enhancement of understanding of the background of the inventive concept, and, therefore, it may contain information that does not form the prior art that is already known to a person of ordinary skill in the art.

SUMMARY

One or more exemplary embodiments provide a method of manufacturing a mask assembly and a method of manufacturing a display apparatus using the mask assembly.

Additional aspects will be set forth in the detailed description which follows, and, in part, will be apparent from the disclosure, or may be learned by practice of the inventive concept.

According to one or more exemplary embodiments, a method of manufacturing a mask assembly includes forming, via an electroforming process, a base material including at least one opening on an electrode plate; and reprocessing the at least one opening using a laser to form at least one reprocessed opening.

According to one or more exemplary embodiments, a method of manufacturing a display apparatus includes: manufacturing a mask assembly; arranging a substrate of the display apparatus to face the mask assembly; and depositing, on the substrate, a deposition material according to at least one first opening in the mask assembly. Manufacturing the mask assembly includes: forming, via an electroforming process, a base material including at least one second opening on an electrode plate; and reprocessing the at least one second opening using a laser to form the at least one first opening.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
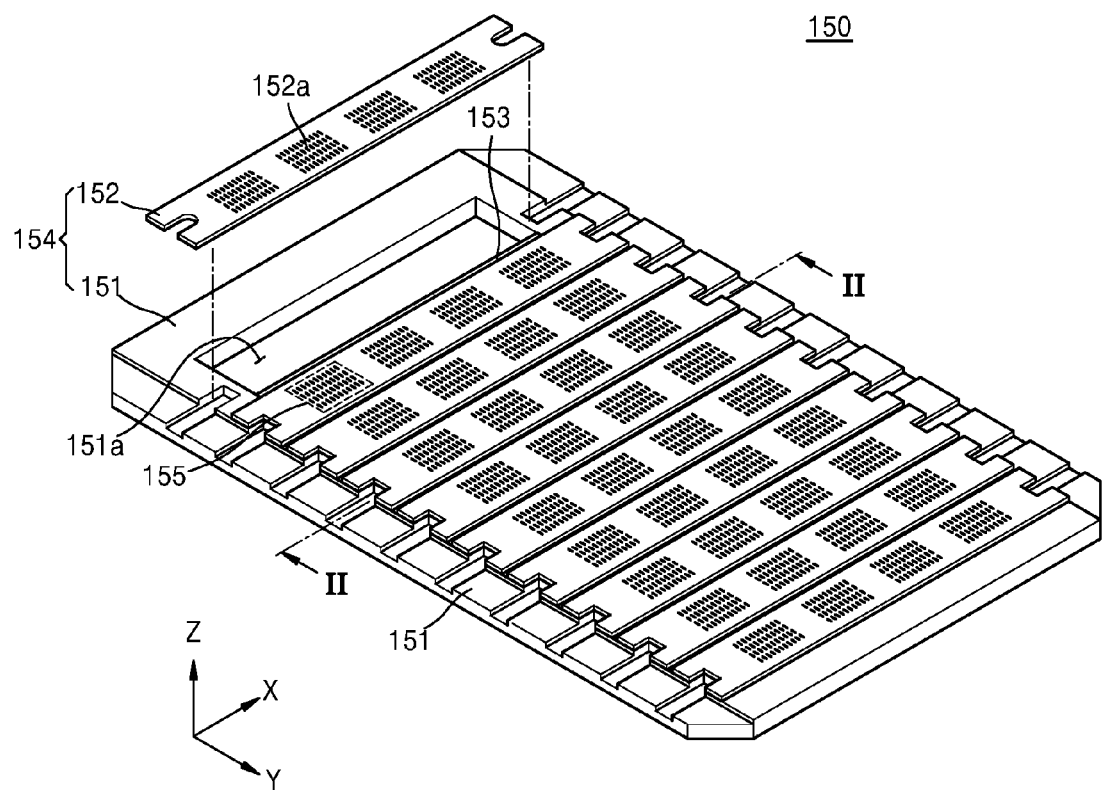
FIG. 1 is a perspective view of a mask assembly, according to one or more exemplary embodiments.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

Unless otherwise specified, the illustrated exemplary embodiments are to be understood as providing exemplary features of varying detail of various exemplary embodiments. Therefore, unless otherwise specified, the features, components, modules, layers, films, panels, regions, and/or aspects of the various illustrations may be otherwise combined, separated, interchanged, and/or rearranged without departing from the disclosed exemplary embodiments. Further, in the accompanying figures, the size and relative sizes of layers, films, panels, regions, etc., may be exaggerated for clarity and descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. Further, the x-axis, the y-axis, and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms "first," "second," etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Although various exemplary embodiments are described with respect to mask frame assemblies that may be utilized to fabricate an organic light emitting display apparatus, it is contemplated that various exemplary embodiments are also applicable to manufacturing semiconductor devices and display devices in general, such as, for example, liquid crystal displays, plasma displays, field emission displays, electrophoretic displays, electrowetting displays, etc.

Figure 2:
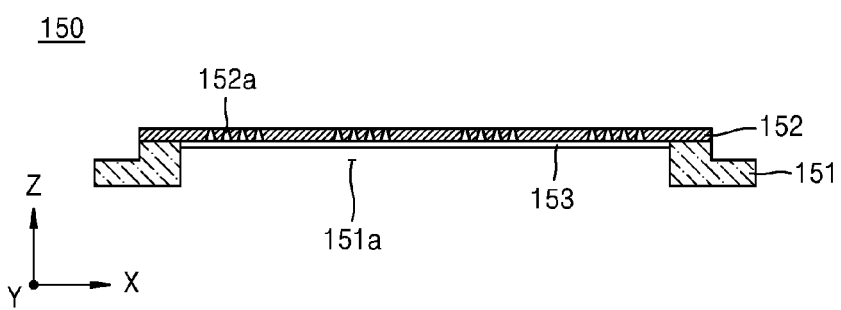
FIG. 2 is a cross-sectional view of the mask assembly of FIG. 1 taken along sectional line II-II, according to one or more exemplary embodiments.

FIG. 1 is a perspective view of a mask assembly, according to one or more exemplary embodiments. FIG. 2 is a cross-sectional view of the mask assembly of FIG. 1 taken along sectional line II-II, according to one or more exemplary embodiments. FIGS. 3A through 3G are cross-sectional views of a mask sheet at various stages of manufacture, according to one or more exemplary embodiments. For descriptive convenience, FIGS. 3A through 3G will be described with reference to manufacturing a mask sheet of the mask assembly of FIG. 1.

Referring to FIGS. 1 and 2, a mask assembly 150 may include a body part 154 and a pattern 155. The body part 154 may include a mask frame 151 and a mask sheet 152. The mask frame 151 and the mask sheet 152 may be separately manufactured and may be coupled to each other. In one or more exemplary embodiments, the mask frame 151 and the mask sheet 152 may be integrally manufactured with one another. Hereinafter, an example, in which the mask frame 151 and the mask sheet 152 are separately manufactured and coupled to each other, is described in detail.

The mask frame 151 may include one frame or a plurality of frames coupled to one another. The mask frame 151 may include an opening 151a in which elements propagate during a manufacturing process, such as a manufacturing process of a display device. In particular, a center portion of the mask frame 151 may define the opening 151a. The center portion of the mask frame 151 may have a lattice shape so that elements propagate through a portion of the mask frame 151.

The mask sheet 152 may be mounted on (or coupled to) the mask frame 151. For instance, the mask sheet 152 and the mask frame 151 may be fit so that the mask sheet 152 completely shields a surface of the mask frame 151. In one or more exemplary embodiments, the mask sheet 152 may be provided in plural and may completely shield a surface of the mask frame 151 as a plurality of the mask sheets 152 is mounted on the mask frame 151 adjacent to one another. For example, the plurality of the mask sheets 152 may completely shield an opening 151a of the mask frame 151.

The pattern 155 may be formed in the mask sheet 152. At least one opening 152a may be formed as part of the pattern 155. The pattern 155 may include a plurality of the openings 152a. For instance, the plurality of openings 152a may be spaced apart from one another and form a certain pattern.

The pattern 155 may have various shapes. For example, only one pattern 155 may be formed on the mask sheet 152. In one or more exemplary embodiments, a plurality of patterns 155 may be formed in the mask sheet 152 and may be spaced apart from one another. The pattern 155 may correspond to a display region (not shown) of a display device (not shown) to be manufactured. For example, when a plurality of display devices are manufactured by depositing deposition materials on a certain area of a mother substrate, in which the deposition materials are spaced apart from one another, the patterns 155 may be formed via the mask sheet 152 so as to respectively correspond to the display devices and regions thereof.

The mask assembly 150 may further include a support frame 153 mounted in (or coupled to) the mask frame 151. The support frame 153 may face the mask sheet 152 and may be disposed between adjacent mask sheets 152. For example, the support frame 153 may prevent the mask frame 151 and/or mask sheets 152 from not only deformation, but also gravitational deflection due to weight of the mask frame 151 and/or mask sheets 152.

A process of manufacturing a mask sheet 152 will now be described with reference to FIGS. 3A through 3G.

Figure 3A:
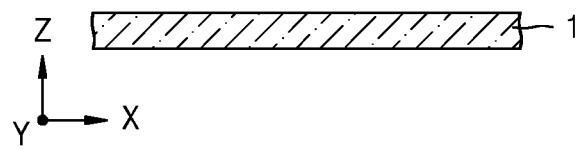
FIGS. 3A, 3B, 3C, 3D, 3E, 3F, and 3G are cross-sectional views of a mask sheet at various stages of manufacture, according to one or more exemplary embodiments.
Figure 3B:
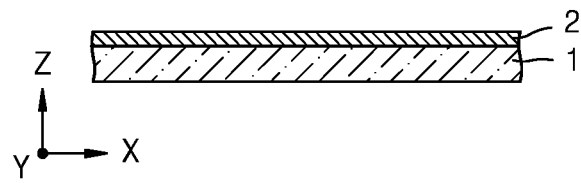
Figure 3C:
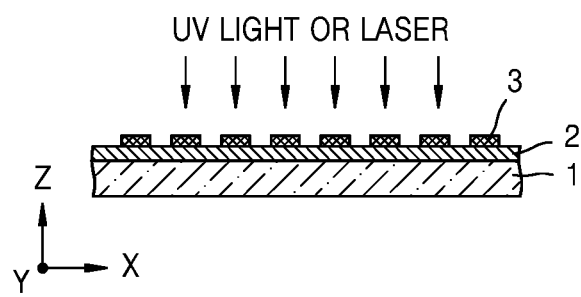

As seen in FIGS. 3A and 3B, a photoresist 2 may be coated on an electrode plate 1. The electrode plate 1 may be formed of a metal material, such as stainless steel (SUS). It is contemplated, however, that any other suitable material may be utilized in association with exemplary embodiments described herein. The photoresist 2 may be formed on the electrode plate 1 using a negative photoresist process or a positive photoresist process. For example, with a negative photoresist process, the photoresist 2 may be coated on the electrode plate 1 and a photomask 3 may be disposed on the photoresist 2, as seen in FIG. 3C. The photoresist 2 may be exposed to illumination, e.g., by radiating ultraviolet (UV) light or laser light towards the photoresist 2. An unexposed portion of the photoresist 2 may be removed with a developer fluid. A positive photoresist process may include the photoresist 2 being coated on the electrode plate 1 and the photomask 3 being disposed on the photoresist 2, as seen in FIG. 3C. The photoresist 2 may be exposed as described above, and the exposed portion of the photoresist 2 may be removed with a developer fluid. Hereinafter, an example in which a pattern of the photoresist 2 is formed using the positive photoresist process is described in detail.

Figure 3D:
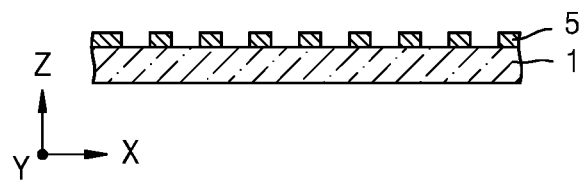

Once the photoresist 2 is formed on the electrode plate 1, the photomask 3 is removed, and the photoresist 2 is developed, a photoresist pattern 5 may remain in an area of the electrode plate 1 where the opening 152a is to be formed, as seen in FIG. 3D.

Figure 3E:
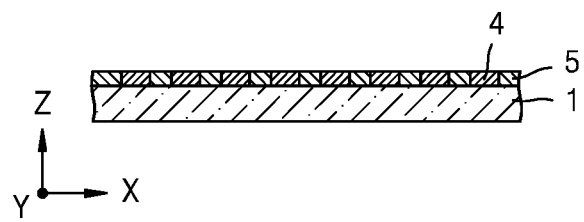

A base material 4 may be formed in an opening in the photoresist pattern 5 using an electroforming process, as seen in FIG. 3E. The base material 4 may be laminated where portions of the photoresist pattern 5 are not formed. At this point, the mask sheet 152 being formed may include nanoscale (nm scale) particles. For example, a size of particles of the mask sheet 152 being formed may be several nanometers to several hundred nanometers. The base material 4 may be formed of a material, such as an alloy of iron and nickel, in which a content of nickel may be about 30 to 50 percent by weight. For instance, the base material 4 may be formed of INVAR.

Figure 3F:
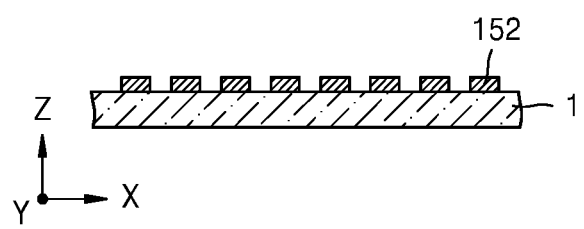
Figure 3G:
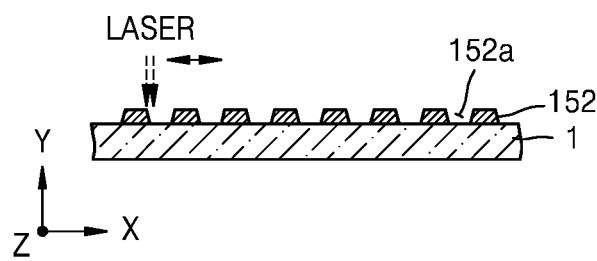

As seen in FIG. 3F, the photoresist pattern 5 may be stripped. Although not illustrated, the mask sheet 152 may be separated from the electrode plate 1. The opening 152a in the mask sheet 152 may be reprocessed using a laser, as seen in FIG. 3G. For example, when the mask sheet 152 is manufactured as described above, a size of the opening 152a in the mask sheet 152 may be different from a designed (or intended) size and shape. If a display device is manufactured using the mask sheet 152, a deposition material may not be formed according to a designed pattern. As such, a resolution of the display device may be reduced or the deposition material may be deposited on an incorrect area of the display device, and, as such, a defect may occur or display quality may be reduced. To provide a relatively higher precision process, the opening 152a in the mask sheet 152 may be reprocessed using a laser.

When a laser radiates the opening 152a, the laser may further process an edge or a center of the opening 152a. The laser may process the edge of the opening 152a obliquely, e.g., to form chamfered edges, as seen in FIG. 3G. For example, a laser may process an edge of the opening 152a to create a variable thickness of the mask sheet 152 that various from a center (or center portion) to an edge of the opening 152a.

The mask sheet 152 manufactured as described above may include the opening 152a, which is a more precise pattern than provided in a mask sheet 152 manufactured using a different method. In this manner, the opening 152a may be the same (or substantially the same) as a designed value, e.g., formed as intended. Conventionally, mask sheets have been manufactured by pressing a base material and radiating the base material with a laser. However, portions of an opening in the base material may be not completely opened or the opening may be different from a designed shape. In the conventional method of manufacturing a mask sheet, since the base material may include microscale (um scale) particle, a lot of smoke and foreign substances may be generated from the base material during laser radiation. The opening may not be precisely processed as the smoke and the foreign substances disturb a route of the laser. In one or more exemplary embodiments, however, the base material 4 may be formed using an electroforming process and the opening 152a may be formed (or reprocessed) with a laser. To this end, a particle size of the base material 4 may be reduced to prevent (or at least reduce) the aforementioned effects associated with the smoke and foreign substances.

When a mask sheet is manufactured by simply performing an electroforming process, it may not be easy to form the opening 152a having an accurate pattern due to the workability of the photoresist 2. According to one or more exemplary embodiments, the opening 152a may be formed having a precise and accurate pattern as the base material 4 is formed using an electroforming process and is precisely processed (or reprocessed) with a laser. In this manner, forming the opening 152a of the base material 4 by performing an electroforming process and by reprocessing the opening 152a with a laser may reduce total manufacturing time and cost required to manufacture the mask sheet 152.

Although not illustrated in FIGS. 3A to 3G, the mask sheet 152 may be fixed to the mask frame 151 in a state of applying a tensile force to the mask sheet 152. In this manner, the mask assembly 150 may be formed as seen in FIGS. 1 and 2. The mask assembly 150 may have a relatively more precise pattern in the opening 152a. Furthermore, the mask assembly 150 may be more rapidly and precisely manufactured.

Figure 4:
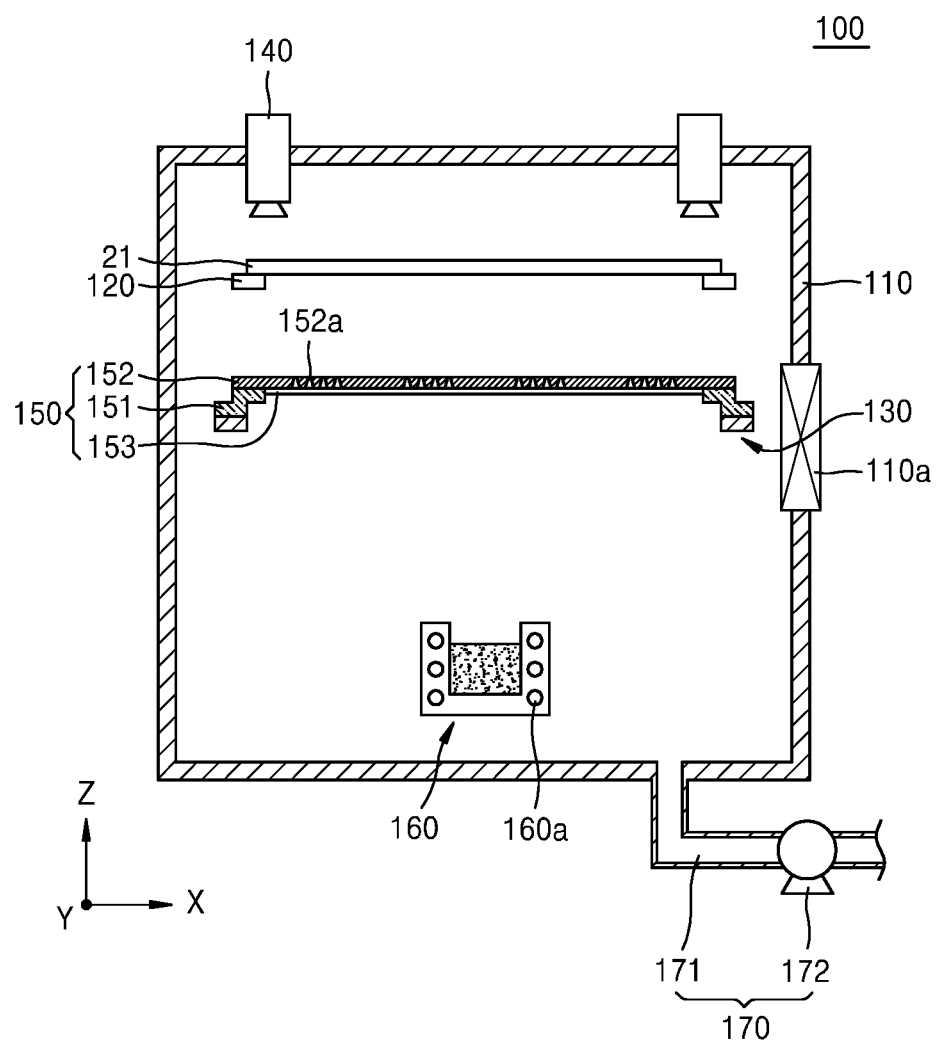
FIG. 4 is a schematic cross-sectional view of a display manufacturing apparatus including the mask assembly of FIG. 1, according to one or more exemplary embodiments.

FIG. 4 is a schematic cross-sectional view of a display manufacturing apparatus including the mask assembly of FIG. 1, according to one or more exemplary embodiments.

Referring to FIG. 4, a display manufacturing apparatus (e.g., a deposition apparatus for manufacturing a display apparatus) 100 may include a chamber 110, the mask assembly 150, a vapor deposition source 160, a substrate supporter 120, a mask assembly supporter 130, a suction part 170, and a vision part 140. The mask assembly 150 may be the mask assembly 150 illustrated and described in association with FIG. 1. Although specific reference will be made to this particular implementation, it is also contemplated that the display manufacturing apparatus 100 may embody many forms and include multiple and/or alternative components.

The chamber 110 may have an inner, pressurized space, and a portion of the chamber 110 may be open. A gate valve 110a, etc., may be installed in the open portion of the chamber 110, to open and close the open portion. A deposition material may be loaded in the vapor deposition source 160, and evaporated and/or sublimated in the vapor deposition source 160. The deposition material may include at least one of an inorganic material, a metal, and an organic material. For descriptive convenience, an example in which the deposition material is an organic material will be discussed. The vapor deposition source 160 may face the mask frame 151, and a portion of the vapor deposition source 160 may be open. Also, the vapor deposition source 160 may include a heater 160a for applying heat to the deposition material.

The substrate supporter 120 may support a substrate 21. The substrate supporter 120 may have various shapes. The substrate supporter 120 may include a shuttle, an electrostatic chuck, a physical sticky chuck, or the like, and may be disposed in the chamber 110. The substrate supporter 120 may include an additional support frame disposed in the chamber 110. For descriptive convenience, an example in which the substrate supporter 120 includes an additional support frame will be discussed.

The deposition material may be deposited on separate regions of the substrate 21. The openings 152a may be disposed in the mask sheet 152 and may be spaced apart from one another. After deposition is complete, the substrate 21 may be divided into multiple portions, and, as such, display devices (not shown) may be formed. In one or more exemplary embodiments, the deposition material may be deposited on the entire substrate 21. In this manner, the opening 152a may be formed in the entire mask sheet 152. After deposition is complete, the substrate 21 may be used to form one display device (not shown). Hereinafter, an example in which the deposition material is deposited on the regions of the substrate 21 which are spaced apart from one another will be discussed.

The mask assembly supporter 130 may be arranged between the substrate supporter 120 and the vapor deposition source 160. The mask assembly 150 may be installed on the mask assembly supporter 130 and may be supported by the mask assembly supporter 130. In this manner, a position of the mask assembly 150 may be adjusted within a range by the mask assembly supporter 130 such that the mask assembly 150 and the substrate 21 may be aligned relative to each other.

The suction part 170 may be connected to the chamber 110 and may maintain an internal pressure of the chamber 110 so that the internal pressure is held constant. The suction part 170 may include a connection pipe 171 connected to the chamber 110 and a pump 172 installed on (or connected to) the connection pump 171.

The vision part 140 may include a camera. The vision part 140 may capture locations of the substrate 21 and the mask assembly 150 and may provide data for arranging the substrate 21 and the mask assembly 150. The mask assembly 150 may be the mask assembly 150 illustrated and described in association with FIGS. 1 and 2.

When the mask assembly 150 and the substrate 21 are prepared, the mask assembly 150 and the substrate 21 may be loaded into the chamber 110. When the gate valve 110a is open, the chamber 100 may be open. The suction part 170 may control the internal pressure of the chamber 110 to be similar to atmospheric pressure. When the gate valve 110a is open, the substrate 21 and the mask assembly 150 may be inserted from the outside of the chamber 110 to the inside. The substrate 21 and the mask assembly 150 may be moved by a robot arm, a shuttle, etc.

When the substrate 21 and the mask assembly 150 are moved to the inside of the chamber 110, the chamber 110 may be closed by operating the gate valve 110a. The suction part 170 may operate so that the internal pressure of the chamber 110 may be in (or substantially in) a vacuum state. Furthermore, the deposition material may be evaporated or sublimated in the vapor deposition source 160 and then may be deposited on the substrate 21 through the mask assembly 150. The deposition material may pass through the openings 152a in the mask sheet 152 and may be deposited on the substrate 21 in a certain pattern.

As described above, when the deposition material passes through the openings 152a in the mask sheet 152, the openings 152a may guide the deposition material to an accurate position on the substrate 21 as a precise pattern is formed thereon. As the opening 152a of the mask sheet 152 is formed obliquely, a shadow phenomenon may be reduced when the deposition material is deposited on the substrate 21. Therefore, the deposition material may be deposited on the substrate 21 in a precise pattern. Furthermore, it may be convenient to manufacture a display device (not shown) with a relatively high resolution by depositing the deposition material on the substrate 21 in an accurate pattern using the mask frame assembly 150.

Figure 5:
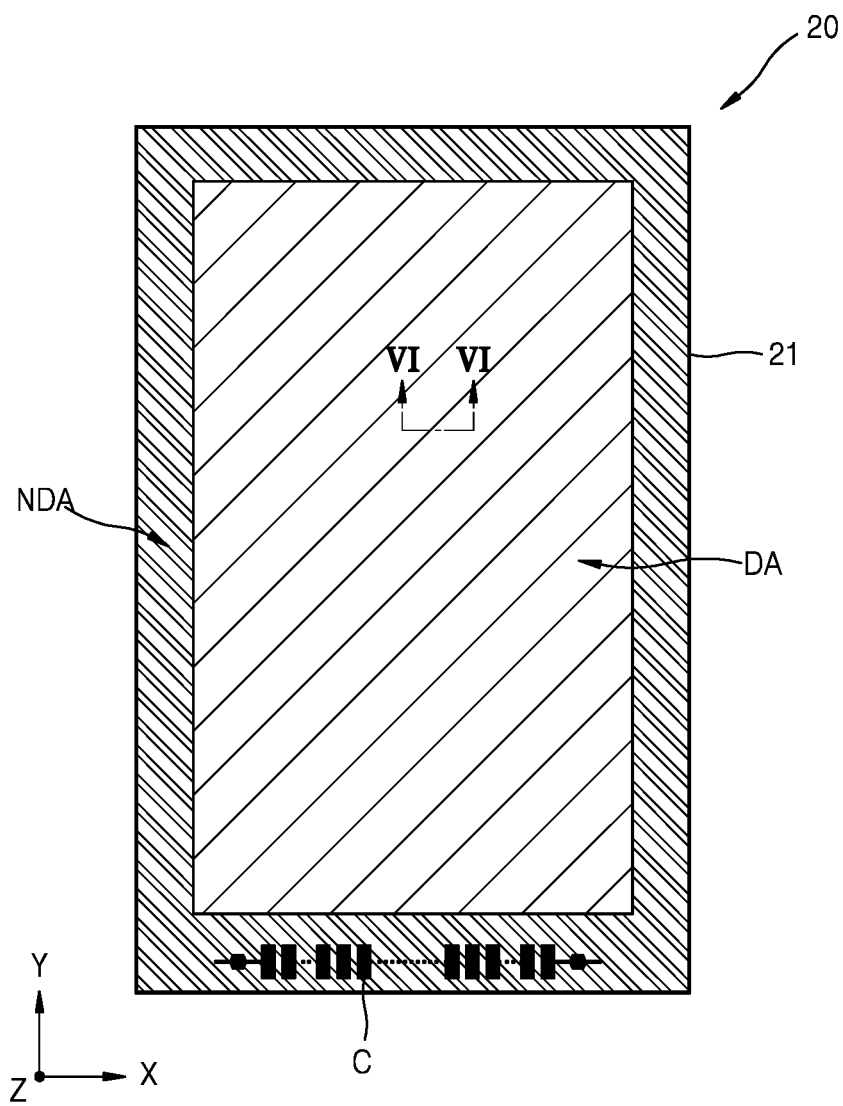
FIG. 5 is a plan view of a display apparatus manufactured using the display manufacturing apparatus of FIG. 4, according to one or more exemplary embodiments.
Figure 6:
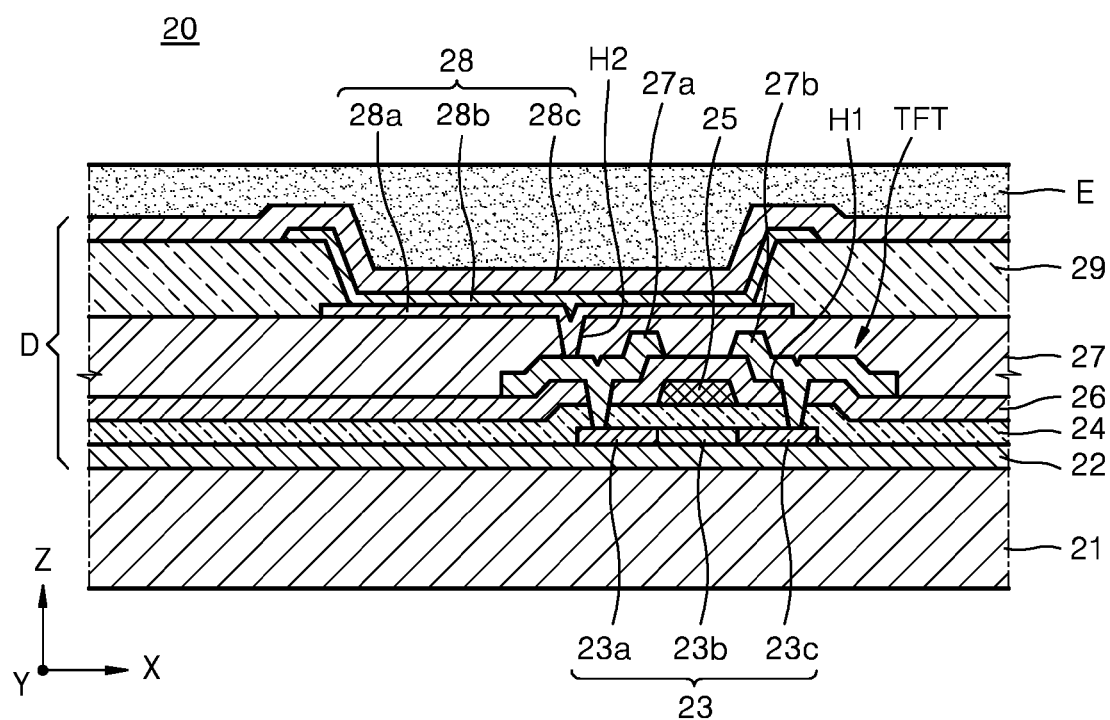
FIG. 6 is a cross-sectional view of a portion of the display apparatus of FIG. 5 taken along sectional line VI-VI, according to one or more exemplary embodiments.

FIG. 5 is a plan view of a display apparatus manufactured using the display manufacturing apparatus of FIG. 4, according to one or more exemplary embodiments. FIG. 6 is a cross-sectional view of a portion of the display apparatus of FIG. 5 taken along sectional line VI-VI, according to one or more exemplary embodiments. For instance, the portion of the display apparatus 20 may be a pixel (or sub-pixel) of the display apparatus 20.

Referring to FIGS. 5 and 6, the display apparatus 20 may include a substrate 21, a light-emitting area D, and a thin-film encapsulation layer E formed above the light-emitting area D. The display apparatus 20 may include a display area DA disposed on the substrate 21 and a non-display area NDA disposed at an outer portion of the display area DA on the substrate 21. The light-emitting area D may be disposed in the display area DA, and a power wire (not shown), etc., may be disposed in the non-display area NDA. Furthermore, a pad area C may be disposed in the non-display area NDA.

The substrate 21 may be formed of any suitable material, such as plastics or a metal material, e.g., stainless steel (SUS) and/or titanium (Ti). For example, the substrate 21 may be a polymer substrate formed of polyimide (PI), polycarbonate (PC), polyethersulphone (PES), polyethylene terephthalate (PET), polyethylene naphthalate (PEN), polyarylate (PAR), fiber glass reinforced plastic (FRP), and/or the like. It is also contemplated that the substrate 21 may be formed of a glass material. The substrate 21 may be transparent, translucent, or opaque. A material of the substrate 21 is not limited to the aforementioned examples. Hereinafter, an example in which the substrate 21 is formed of polyimide is described in detail.

The light-emitting area D may be formed on the substrate 21. The light-emitting area D may include a thin film transistor TFT. A passivation layer 27 may be formed on a top surface of the thin film transistor TFT, and an organic light emitting device (OLED) 28 may be formed on the passivation layer 27.

A buffer layer 22 formed of an organic compound and/or an inorganic compound may be further formed on a top surface of the substrate 21. For example, the buffer layer 22 may be an inorganic material, such as silicon oxide ($SiO_x$ ($x \geq 1$)), silicon nitride ($SiN_x$ ($x \geq 1$)), silicon oxynitride ($SiO_xN_y$, ($x, y \geq 1$)), aluminum oxide ($AlO_x(x \geq 1)$), aluminum oxynitride ($AlO_xN_y$ ($x, y \geq 1$)), or an organic material, such as acryl, polyimide, or polyester and/or the like.

After an active layer 23 having a certain pattern is formed on the buffer layer 22, the active layer 23 is buried by a gate insulating layer 24. The active layer 23 has a source area 23a and a drain area 23c, and further includes a channel area 23b therebetween. The active layer 23 may be formed to contain various materials. For example, the active layer 23 may contain an inorganic semiconductor material, such as amorphous silicon or crystalline silicon. As another example, the active layer 23 may contain an oxide semiconductor. For instance, an oxide semiconductor may include an oxide of a material selected from a metal element in a group 12, 13, or 14, such as zinc (Zn), indium (In), gallium (Ga), tin (Sn), cadmium (Cd), germanium (Ge), or hafnium (Hf), or a combination thereof. As another example, the active layer 23 may include an organic semiconductor material. Hereinafter, an example in which the active layer 23 is formed of amorphous silicon is described in detail.

The active layer 23 may be formed by forming an amorphous silicon film on the buffer layer 22, crystallizing the amorphous silicon film into a polycrystalline silicon film, and patterning the polycrystalline silicon film. The source region 23a and the drain region 23c of the active layer 23 may be doped with impurities according to a type of the thin-film transistor TFT, such as a driving thin-film transistor TFT (not shown), a switching thin-film transistor TFT (not shown), and the like.

A gate electrode 25 corresponding to the active layer 23 and an interlayer insulating layer 26 that buries the gate electrode 25 are formed on a top surface of the gate insulating layer 24. After a contact hole H1 is formed in the interlayer insulating layer 26 and the gate insulating layer 24, a source electrode 27a and a drain electrode 27b are formed on the interlayer insulating layer 26 to respectively contact the source area 23a and the drain area 23b.

The passivation layer 27 is formed on a top surface of the thin film transistor TFT, and a pixel electrode 28a of the OLED 28 is formed on the passivation layer 27. The pixel electrode 28a may be a transparent (or translucent) electrode or a reflective electrode. If the pixel electrode 28a is a transparent (or translucent) electrode, the pixel electrode 28a may be formed of, for example, indium tin oxide (ITO), indium zinc oxide (IZO), zinc oxide (ZnO), indium oxide ($In_2O_3$), indium gallium oxide (IGO), or aluminum zinc oxide (AZO). If the pixel electrode 28a is a reflective electrode, the pixel electrode 28a may include a reflective layer formed of silver (Ag), magnesium (Mg), Al, platinum (Pt), palladium (Pd), gold (Au), nickel (Ni), neodymium (Nd), iridium (Ir), chrome (Cr), or a compound thereof, and a layer formed of ITO, IZO, ZnO, or $In_2O_3$. However, a constitution and a material of the pixel electrode 28a is not limited thereto, and may be variously modified.

The pixel electrode 28a contacts the drain electrode 27b of the thin-film transistor TFT via a via hole H2 formed in the passivation layer 27. The passivation layer 27 may be formed of an inorganic and/or an organic material, or formed to have a single layer or two or more layers. The passivation layer 27 may be formed as a planarization layer so that a top surface is smooth regardless of unevenness of a lower layer. However, the passivation layer 27 may also be formed to be uneven according to unevenness of a layer below the passivation layer 27. In addition, the passivation layer 27 may be formed of a transparent insulator so that a resonance effect may be obtained.

After the pixel electrode 28a is formed on the passivation layer 27, a pixel-defining layer 29 is formed of an organic and/or inorganic material to cover the pixel electrode 28a and the passivation layer 27, and to have an opening to expose the pixel electrode 28a. In addition, an intermediate layer 28b and an opposite electrode 28c are formed on the pixel electrode 28a. The pixel electrode 28a functions as an anode electrode, and the opposite electrode 28c functions as a cathode electrode. However, polarities of the pixel electrode 28a and the opposite electrode 28c may be changed with each other. The pixel electrode 28a and the opposite electrode 28c are insulated from each other by the intermediate layer 28b. An organic emission layer emits light as voltages having different polarities from each other are applied to the intermediate layer 28b.

The intermediate layer 28b may include the organic emission layer. As another selective example, the intermediate layer 28b may include the organic emission layer, and further include at least one selected from the group consisting of a hole injection layer (HIL), a hole transport layer (HTL), an electron transport layer (ETL), and an electron injection layer (EIL). However, exemplary embodiments are not limited thereto. The intermediate layer 28b may include the organic emission layer and may further include various functional layers (not shown). The intermediate layer 28b may be formed by the display manufacturing apparatus illustrated and described in association with FIG. 4.

One unit pixel includes sub-pixels, and the sub-pixels may emit various colors of light. For example, the sub-pixels may respectively emit red light, green light, and blue light or may respectively emit red light, green light, blue light, and white light. It is contemplated, however, that any suitable color and/or groups of colors of light may be utilized in association with exemplary embodiments described herein. Although a light emitting material is separately included in the respective pixels/sub-pixels in the organic light emission layer according to exemplary embodiments, the present inventive concept is not limited thereto. The organic light emission layer may be a common organic light emission layer usable for the entire pixels/sub-pixels regardless of locations of the pixels/sub-pixels.

After the display unit D is formed on the substrate 21, the thin-film encapsulation layer E may be formed on the display unit D. The thin-film encapsulation layer E may include a plurality of inorganic layers, or an inorganic layer and an organic layer. For instance, an organic layer of the thin-film encapsulation layer E may be formed of a polymer material, and may be a single layer formed of one selected from polyethylene terephthalate, polyimide, polycarbonate, epoxy, polyethylene, and polyacrylate, or layers in which such materials are stacked on top of each other. The organic layer may be formed of polyacrylate, and may include a material obtained by polymerizing a monomer composition that includes diacrylate-based monomer and triacrylate-based monomer. Monoacrylate-based monomer may be further included in the monomer composition. A photoinitiator, such as a thermoplastic polyolefin (TPO), may be included in the monomer composition. However, the monomer composition is not limited thereto, and may include, for instance, epoxy, polyimide, polyethylene terephthalate, polycarbonate, polyethylene, or polyacrylate.

The inorganic layer included in the thin-film encapsulation layer E may be a single layer or stacked layers that include metal oxide or metal nitride. For example, the inorganic layer may include one selected from $SiN_x$, $Al_2O_3$, $SiO_2$, titanium oxide ($TiO_2$), zirconium oxide ($ZrO_x$), and ZnO. An uppermost layer in the thin-film encapsulation layer E, exposed to an outside, may be formed of an inorganic layer to prevent moisture penetration into the OLED.

The thin-film encapsulation layer E may include at least one sandwich structure in which at least one organic layer is inserted between at least two inorganic layers. As another example, the thin-film encapsulation layer E may include at least one sandwich structure in which at least one inorganic layer is inserted between at least two organic layers. As another example, the thin-film encapsulation layer E may include a sandwich structure in which at least one organic layer is inserted between at least two inorganic layers and a sandwich structure in which at least one inorganic layer is inserted between at least two organic layers.

The thin-film encapsulation layer E may include a first inorganic layer, a first organic layer, and a second inorganic layer sequentially formed from a top of the OLED. As another example, the thin-film encapsulation layer E may include a first inorganic layer, a first organic layer, a second inorganic layer, a second organic layer, and a third inorganic layer sequentially formed from a top of the OLED. As another example, the thin-film encapsulation layer E may include a first inorganic layer, a first organic layer, a second inorganic layer, a second organic layer, a third inorganic layer, a third organic layer, and a fourth inorganic layer sequentially formed from a top of the OLED.

A halogenated metal layer that includes lithium-fluoride (LiF) may be further included between the OLED and the first inorganic layer. The halogenated metal layer may prevent damage to the OLED when the first inorganic layer is formed using, for example, a sputtering method. An area of the first organic layer may be smaller than an area of the second inorganic layer, and an area of the second organic layer may be smaller than an area of the third inorganic layer. However, the thin-film encapsulation layer E is not limited thereto, and may include any structure in which an inorganic layer and an organic layer are stacked on top of each other in various forms.

Although not illustrated, the display apparatus 20 may further include a protection layer formed on the thin-film encapsulation layer E. The protection layer may be formed using various methods. For example, the protective layer may be formed using a sputtering method, an ion beam deposition method, an evaporation method, a general chemical vapor deposition method, or the like. The protective layer may include a metallic oxide or nitride, such as $SiN_x$, $SiO_xN_y$, titanium oxide ($TiO_x$), titanium nitride ($TiN_x$), titanium oxynitride ($TiO_xN_y$), $ZrO_x$, tantalum nitride ($TaN_x$), tantalum oxide ($TaO_x$), hafnium oxide ($HfO_x$), $AlO_x$, or the like. The protective layer may be formed to completely surround a side of the encapsulation layer E. In this manner, the protective layer may increase life expectancy of the encapsulation layer E by obstructing the encapsulation layer E from moisture or oxygen.

According to one or more exemplary embodiments, the display apparatus 20 may include the intermediate layer 28b generating an accurate pattern, and as the intermediate layer 28b is deposited on an accurate location, an image may be precisely produced. Furthermore, even if the intermediate layer 28b is repeatedly deposited, the display apparatus 20 may generate a uniform pattern and, as such, may keep producing images having uniform quality.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A method of manufacturing a mask assembly, the method comprising:
   forming, on an electrode plate, a photoresist pattern comprising at least one opening;
   forming, via an electroforming process, a base material on the electrode plate in the at least one opening; and
   reprocessing the at least one opening using a laser to form at least one reprocessed opening.

2. The method of claim 1, wherein edges of the at least one reprocessed opening are sloped with respect to a surface of the electrode plate.

3. The method of claim 1, wherein the photoresist pattern is formed using a positive photoresist process.

4. The method of claim 1, wherein the photoresist pattern is formed using a negative photoresist process.

5. The method of claim 1, wherein the forming of the base material on the electrode plate further comprises removing the photoresist pattern.

6. The method of claim 1, wherein the base material comprises nanoscale particles.

7. A method of manufacturing a mask assembly, the method comprising:
   forming, via an electroforming process, a base material comprising at least one opening on an electrode plate;
   reprocessing the at least one opening using a laser to form at least one reprocessed opening;
   separating the base material from the electrode plate; and
   supporting the base material across an opening in a mask frame.

8. The method of claim 7, wherein the base material is supported, under tension, across the opening in the mask frame.

9. The method of claim 7, wherein:
   the mask frame comprises a support frame extending across the opening in the mask frame; and
   the base material is supported on the support frame.

10. A method of manufacturing a display apparatus, the method comprising:
    manufacturing a mask assembly;
    arranging a substrate of the display apparatus to face the mask assembly; and
    depositing, on the substrate, a deposition material according to at least one first opening in the mask assembly,
    wherein manufacturing the mask assembly comprises:

forming, via an electroforming process, a base material comprising at least one second opening on an electrode plate; and reprocessing the at least one second opening using a laser to form the at least one first opening.

11. The method of claim 10, wherein edges of the at least one first opening are sloped with respect to a surface of the electrode plate.

12. The method of claim 10, wherein forming of the base material on the electrode plate comprises:

forming, on the electrode plate, a photoresist pattern comprising the at least one second opening; and forming, using the electroforming process, the base material on the electrode plate in the at least one second opening.

13. The method of claim 12, wherein the photoresist pattern is formed using a negative photoresist process.

14. The method of claim 12, wherein the photoresist pattern is formed using a positive photoresist process.

15. The method of claim 12, wherein forming the base material on the electrode plate further comprises removing the photoresist pattern.

16. The method of claim 10, wherein the base material comprises nanoscale particles.

17. The method of claim 10, wherein manufacturing the mask assembly further comprises:

separating the base material from the electrode plate; and supporting the base material across an opening in a mask frame.

18. The method of claim 17, wherein the base material is supported, under tension, across the opening in the mask frame.

19. The method of claim 17, wherein:

the mask frame comprises a support frame extending across the opening in the mask frame; and the base material is supported on the support frame.

* * * * *